US008287653B2

(12) United States Patent
Robinson et al.

(10) Patent No.: US 8,287,653 B2
(45) Date of Patent: Oct. 16, 2012

(54) DEBRIS REMOVAL IN HIGH ASPECT STRUCTURES

(75) Inventors: Tod Evan Robinson, Boynton Beach, FL (US); Bernabe J. Arruza, Boca Raton, FL (US); Kenneth Gilbert Roessler, Boca Raton, FL (US)

(73) Assignee: Rave, LLC, Delray Beach, FL (US)

( * ) Notice: Subject to any disclaimer, the term of this patent is extended or adjusted under 35 U.S.C. 154(b) by 333 days.

(21) Appl. No.: 11/898,836

(22) Filed: Sep. 17, 2007

(65) Prior Publication Data

US 2009/0071506 A1 Mar. 19, 2009

(51) Int. Cl.
*B08B 7/00* (2006.01)
*B08B 7/04* (2006.01)

(52) U.S. Cl. ............ 134/6; 134/10; 134/26; 134/42; 15/104.001; 15/104.002; 15/209.1; 15/210.1

(58) Field of Classification Search ............ 134/6, 10, 134/42, 26; 15/104.001, 104.002, 290.1, 15/210.1, 209.1
See application file for complete search history.

(56) References Cited

U.S. PATENT DOCUMENTS

| | | | | |
|---|---|---|---|---|
| 5,102,768 A * | 4/1992 | Light et al. | ............... | 430/125.5 |
| 5,220,279 A * | 6/1993 | Nagasawa | ............... | 324/754.03 |
| 5,634,230 A * | 6/1997 | Maurer | ............... | 15/1.51 |
| 5,935,339 A * | 8/1999 | Henderson et al. | ............... | 134/1 |
| 6,056,627 A * | 5/2000 | Mizuta | ............... | 451/59 |
| 6,130,104 A * | 10/2000 | Yamasaka | ............... | 438/14 |
| 6,175,984 B1 * | 1/2001 | Prime et al. | ............... | 15/104.002 |
| 6,263,176 B1 * | 7/2001 | An et al. | ............... | 399/101 |
| 6,817,052 B2 * | 11/2004 | Grube | ............... | 15/3 |
| 6,840,374 B2 * | 1/2005 | Khandros et al. | ............... | 206/223 |
| 6,861,648 B2 * | 3/2005 | Kley | ............... | 850/20 |
| 6,896,741 B2 * | 5/2005 | Stelcher | ............... | 134/6 |
| 6,908,364 B2 * | 6/2005 | Back et al. | ............... | 451/36 |
| 2005/0151385 A1 * | 7/2005 | Autumn et al. | ............... | 294/86.4 |
| 2005/0242072 A1 * | 11/2005 | Van Den Oetelaar | ............... | 219/121.69 |
| 2005/0266586 A1 * | 12/2005 | Linder et al. | ............... | 438/4 |
| 2006/0001438 A1 * | 1/2006 | Humphrey et al. | ............... | 324/754 |
| 2006/0211252 A1 * | 9/2006 | Hopkins et al. | ............... | 438/712 |
| 2006/0270231 A1 | 11/2006 | Tran et al. | | |
| 2008/0169003 A1 * | 7/2008 | Curtis | ............... | 134/1 |

FOREIGN PATENT DOCUMENTS

JP 2003167003 A * 6/2003
JP 2006184081 A2 7/2006

* cited by examiner

*Primary Examiner* — Alexander Markoff
(74) *Attorney, Agent, or Firm* — Baker & Hostetler LLP

(57) ABSTRACT

A method of debris removal is provided. The method includes positioning a nanometer-scaled tip adjacent to a piece of debris on a substrate. The method also includes adhering the piece of debris to the tip. In addition, the method also includes removing the piece of debris from the substrate by moving the tip away from the substrate.

10 Claims, 5 Drawing Sheets

DEBRIS REMOVAL IN HIGH ASPECT STRUCTURES

FIELD OF THE INVENTION

"The invention will now be described with reference to the drawing figures, in which like reference numerals refer to like parts throughout. FIG. 1 illustrates a cross-sectional view of a portion of a debris removal device 10 according to an embodiment of the present invention. The device 10 includes an atomic force microscope with a cantilever arm attached to a nanometer-scaled tip 12 positioned adjacent to a patch 14 of low surface energy material."

BACKGROUND OF THE INVENTION

Nanomachining, by definition, involves mechanically removing nanometer-scaled volumes of material from, for example, a photolithography mask, a semiconductor substrate/wafer, or some other monolith. For the purposes of this discussion, "substrate" will refer to any object upon which nanomachining may be performed.

Typically, nanomachining is performed by applying forces to a surface of a substrate with a tip (e.g., a diamond cutting bit) that is positioned on a cantilever arm of an atomic force microscope (AFM). More specifically, the tip is typically first inserted into the surface of the substrate. Then, the tip is dragged through the substrate in a plane that is parallel to the surface (i.e., the xy-plane). This results in displacement and/or removal of material from the substrate as the tip is dragged along.

As a result of this nanomachining, debris is generated on the substrate. More specifically, small particles may form during the nanomachining process as material is removed. These particles, in some instances, remain on the substrate once the nanomachining process is over. Such particles are often found, for example, in trenches and/or cavities present on the substrate.

In order to remove such debris, particularly in high-aspect photolithography mask structures and electronic circuitry, wet cleaning techniques are often used. More specifically, the use of chemicals in a liquid state and/or agitation of the overall mask or circuitry is typically employed. However, both chemical methods and agitation methods such as, for example, megasonic agitation, can destroy both high-aspect ratio structures and mask optical proximity correction features (i.e., features that are generally so small that these features do not image, but rather form diffraction patterns that are used beneficially by mask designers to form patterns).

In order to better understand why high-aspect shapes and structures are particularly susceptible to being destroyed by chemicals and agitation, one has to recall that such shapes and structures, by definition, include large amounts of surface area and are therefore very thermodynamically unstable. As such, these shapes and structures are highly susceptible to delamination and/or other forms of destruction when chemical and/or mechanical energy is applied.

In view of the above, other currently available methods for removing debris from a substrate make use of cryogenic cleaning systems and techniques. When employing such systems and techniques, the substrate containing the high aspect shapes and/or structures is effectively "sandblasted" using carbon dioxide particles instead of sand.

Unfortunately, even cryogenic cleaning systems and processes are also known to destroy high aspect features. In addition, cryogenic cleaning processes affect a relatively large area of a substrate (e.g., areas that may be approximately 10 millimeters across or more). Naturally, this means that areas of the substrate that may not need to have debris removed therefrom are nonetheless exposed to the cleaning process and to the potential structure-destroying energies associated therewith.

SUMMARY OF THE INVENTION

At least in view of the above, what is needed are novel debris-removal methods and devices that are capable of cleaning substrates with high aspect structures, mask optical proximity correction features, etc., without destroying such structures and/or features.

The foregoing needs are met, to a great extent, by certain embodiments of the present invention. According to one such embodiment, a method of debris removal is provided. The method includes positioning a nanometer-scaled tip adjacent to a piece of debris on a substrate. The method also includes physically adhering the piece of debris to the tip. In addition, the method also includes removing the piece of debris from the substrate by moving the tip away from the substrate.

In accordance with another embodiment of the present invention, a debris removal device is provided. The device includes a nanometer-scaled tip positioned adjacent to a substrate. The device also includes a coating formed on the tip, wherein the coating includes a low surface energy material. In addition, the device also includes a piece of low surface energy material positioned adjacent to the substrate.

In accordance with yet another embodiment of the present invention, a debris removal device is provided. The device includes means for positioning a nanometer-scaled tip adjacent to a piece of debris on a substrate. The device also includes means for physically adhering the piece of debris to the tip. In addition, the device also includes means for removing the piece of debris from the substrate by moving the tip away from the substrate.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
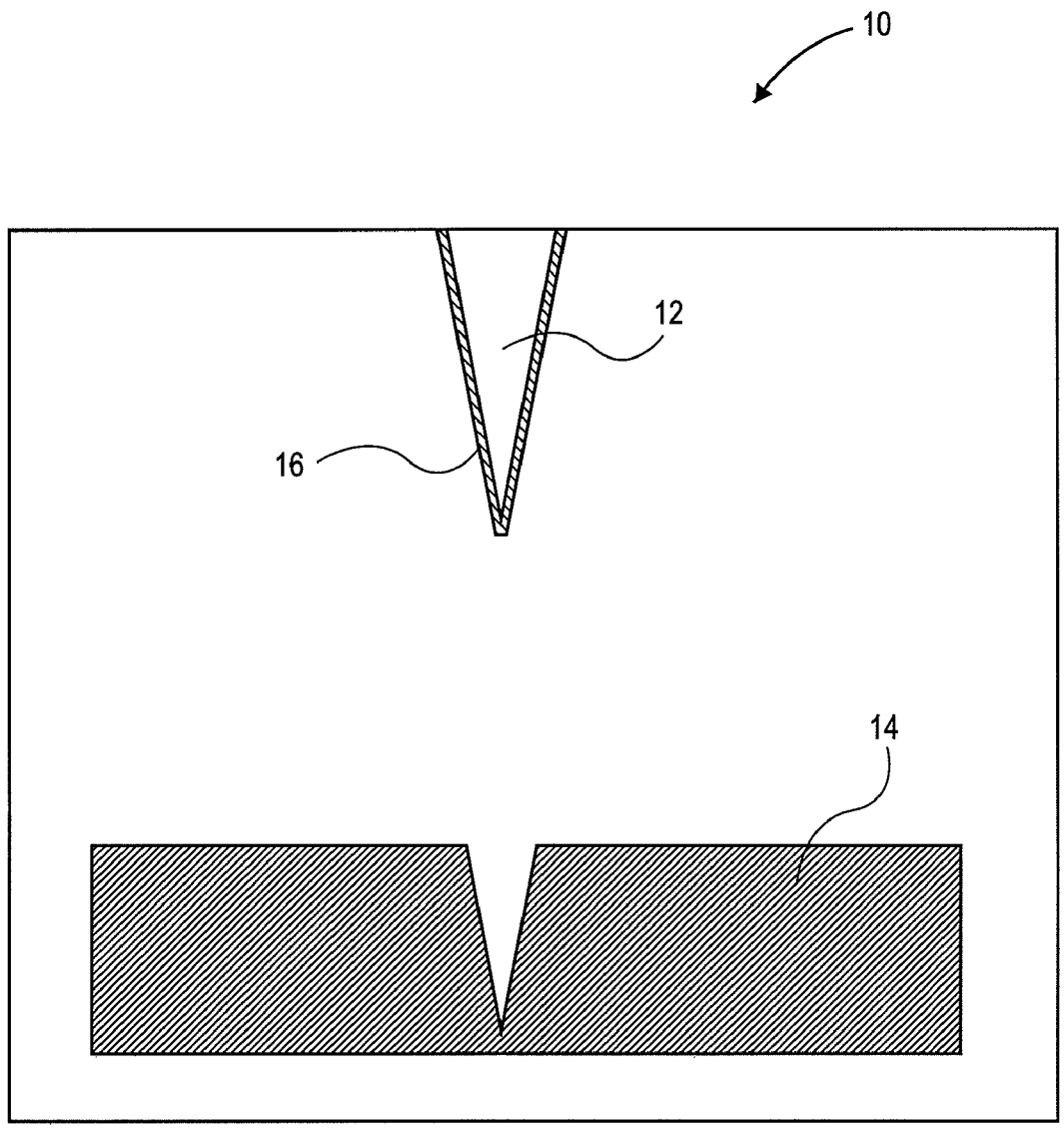
FIG. 1 illustrates a cross-sectional view of a portion of a debris removal device according to an embodiment of the present invention.

The invention will now be described with reference to the drawing figures, in which like reference numerals refer to like parts throughout. FIG. 1 illustrates a cross-sectional view of a portion of a debris removal device 10 according to an embodiment of the present invention. The device 10 includes a nanometer-scaled tip 12 positioned adjacent to a patch 14 of low surface energy material.

Formed on the tip 12 is a coating 16. Before forming the coating 16, tip 12 may be pre-coated or otherwise surface treated to modify the surface energy of the tip 12 (e.g., to modify the capillary, wetting, and/or surface tension effects). When properly selected, the coating 16 allows the tip 12 to remain sharper for a longer period of time than an uncoated tip. For example, a PTFE-coated diamond tip can have a longer operating life than an uncoated diamond tip.

According to certain embodiments of the present invention, the coating 16 includes the same low surface energy material found in the patch 14. Also, according to certain embodiments of the present invention, the tip 12 may be in direct contact with the patch 14 and the coating 16 may be formed on the tip (or replenished) by rubbing the tip 12 against the patch 14. Typically, rubbing of the tip against the patch and/or scratching the pad 14 with the tip 12 also causes enhanced surface diffusion of the low surface energy material over the tip 12 surface.

According to certain embodiments of the present invention, the coating 16 and the patch 14 are both made from, or at least may include, polytetrafluoroethylene (PTFE) or some other similar material. According to other embodiments of the present invention, the coating 16 may, but does not necessarily, include a metallic material, oxide, metal oxide, or some other high surface energy coating or treatment (e.g., surface roughening or doping) between the tip 12 and the low-surface energy material included in the coating. This high surface energy material typically acts to more strongly bind the low-surface energy material to the tip 12 and to attract or adhere the particle preferentially to the tip surface.

A high-surface energy pre-treatment is used without a low-surface energy coating 16 according to certain embodiments of the present invention. In such embodiments, the particles 20 discussed below may be embedded in some other soft targets (e.g., Au, Al) using similar methods to those discussed herein, or the tip may be a consumable. Also, other physical and/or environmental parameters may be modified (e.g., temperature, pressure, chemistry, humidity) to enhance tip treatment and/or particle pick-up/drop-off.

Figure 2:
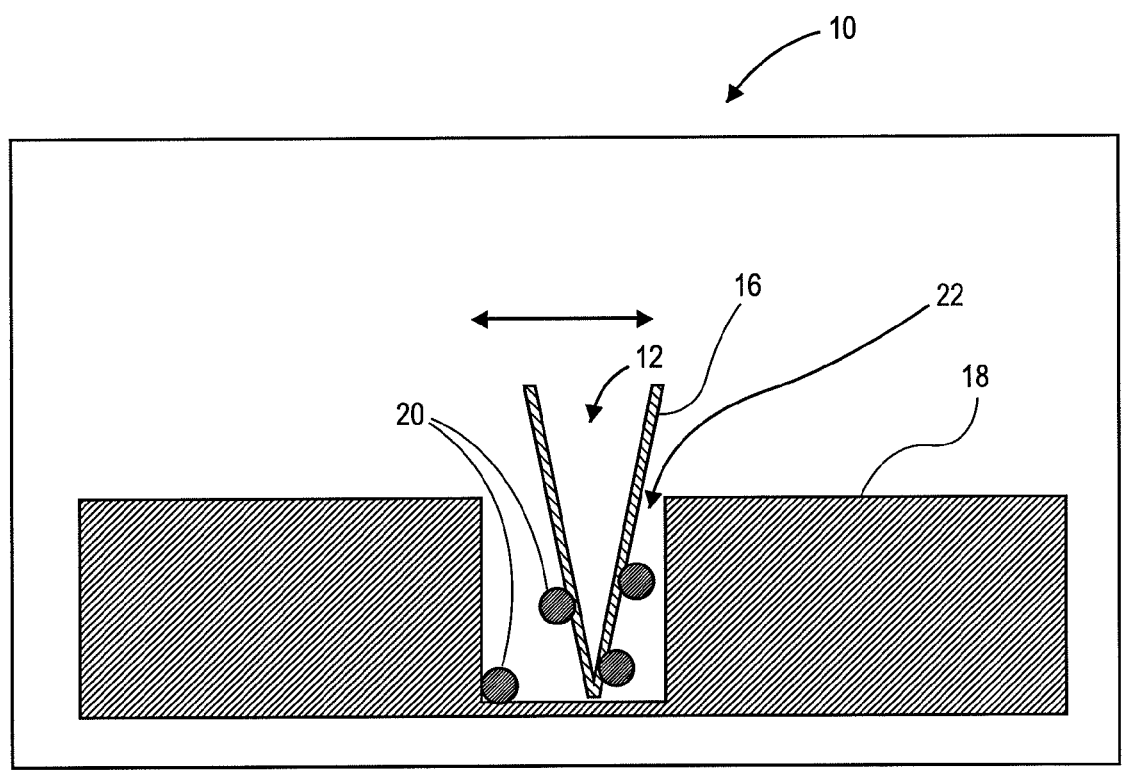
FIG. 2 illustrates a cross-sectional view of another portion of the debris removal device illustrated in FIG. 1.

According to certain embodiments of the present invention, all of the components illustrated in FIGS. 1 and 2 are included in an AFM. In some such configurations, the patch 14 is substantially flat and is attached to a stage that supports the substrate 18. Also, according to certain embodiments of the present invention, the patch 14 is removable from the stage and may easily be replaced. For example, the patch 14 may be affixed to the AFM with an easily releasable clamp (not illustrated).

FIG. 2 illustrates a cross-sectional view of another portion of the debris removal device 10 illustrated in FIG. 1. Illustrated in FIG. 2 is a substrate 18 that is typically positioned adjacent to the patch 14 illustrated in FIG. 1. Also illustrated in FIG. 2 is a plurality of particles 20 that are present in a trench 22 that is formed on the surface of the substrate 18. The particles 20 are typically attached to the surface via Van der Waals short-range forces. In FIG. 2, the tip 12 is positioned adjacent to the substrate 18. In order to reach the bottom of the trench 22, the tip 12 in the embodiment of the present invention illustrated in FIGS. 1 and 2 is a high aspect ratio tip. Although a trench 22 is illustrated in FIG. 2, the particles 20 may be included in other structures.

Figure 3:
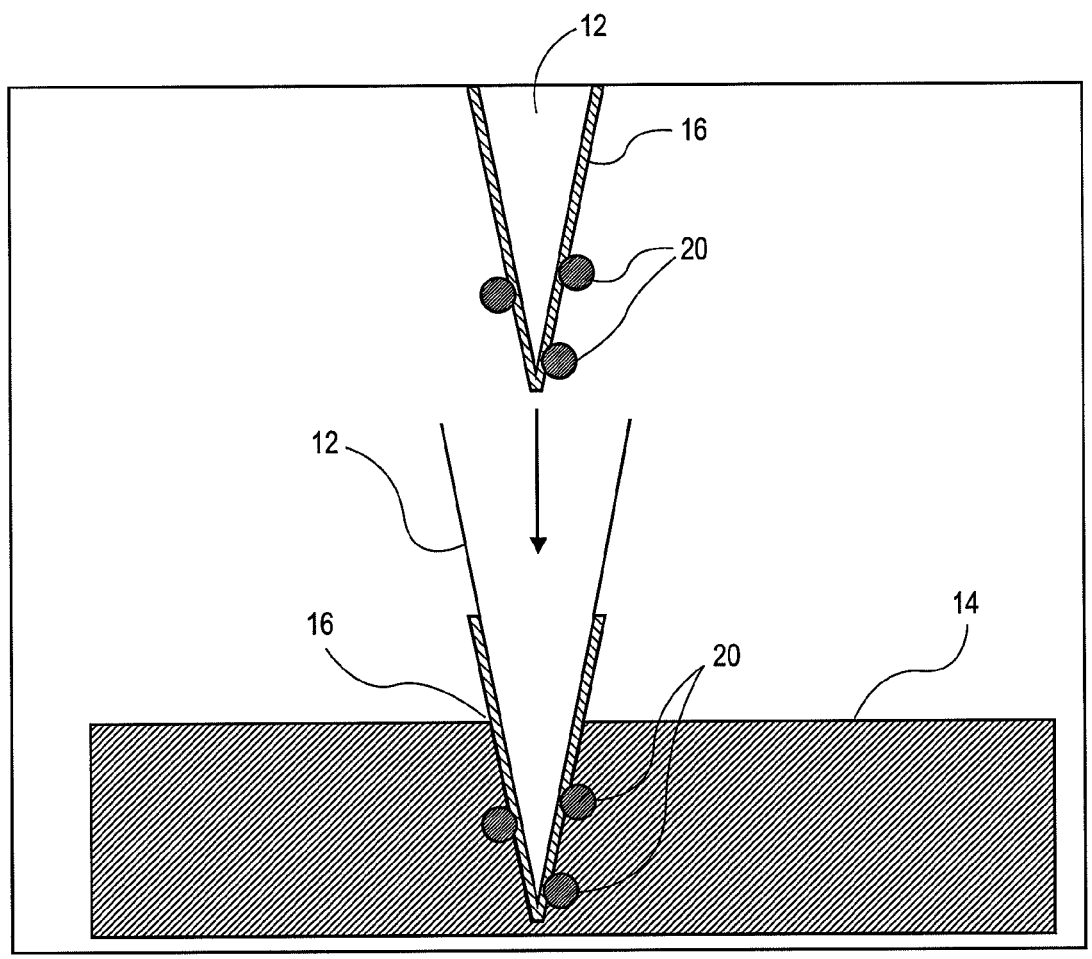
FIG. 3 illustrates a cross-sectional view of the portion of the debris removal device illustrated in FIG. 1, wherein particles are being imbedded in the patch.
Figure 4:
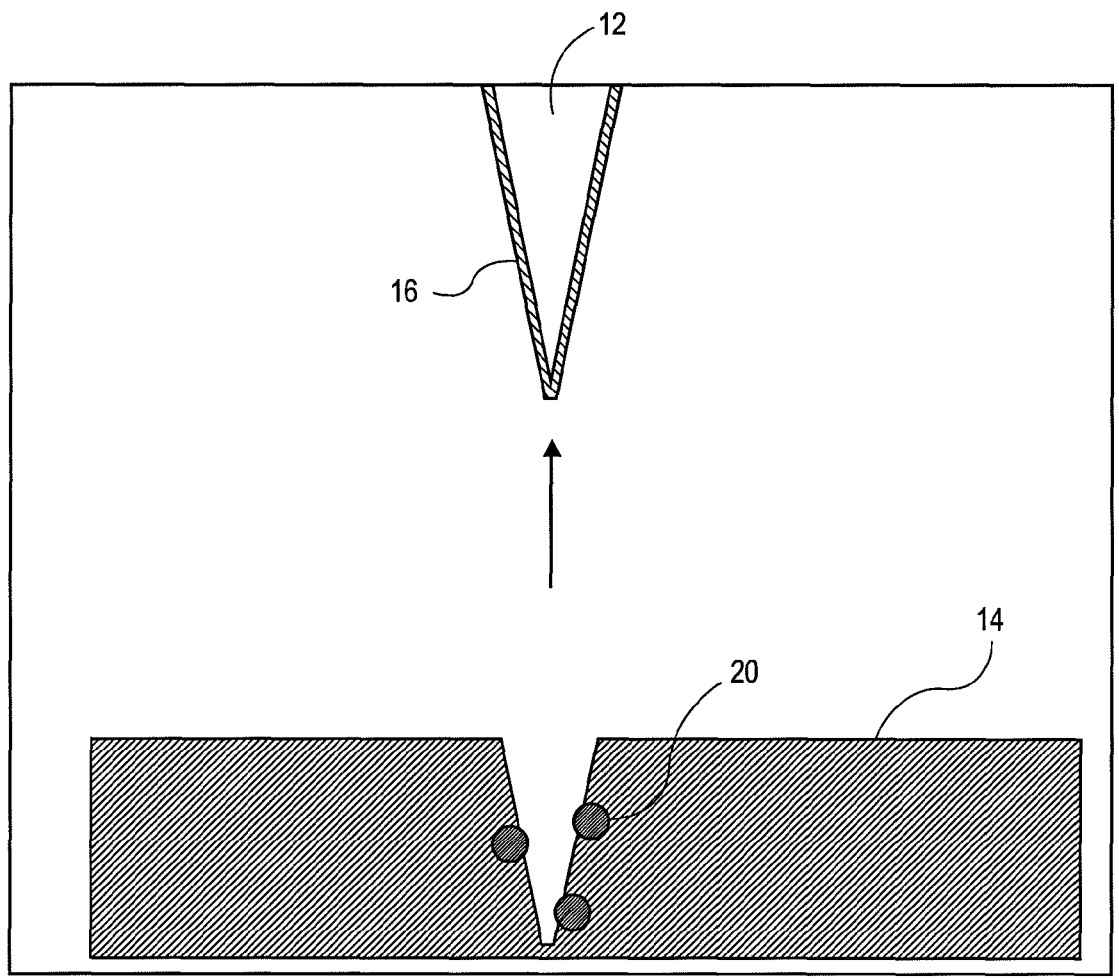
FIG. 4 illustrates a cross-sectional view of the portion of the debris removal device illustrated in FIG. 3, wherein the tip is no longer in contact with the patch.

FIG. 3 illustrates a cross-sectional view of the portion of the debris removal device 10 illustrated in FIG. 1, wherein particles 20 are being imbedded in the patch 14. Then, FIG. 4 illustrates a cross-sectional view of the portion of the debris removal device 10 illustrated in FIG. 3, wherein the tip 12 is no longer in contact with the patch 14.

According to certain embodiments of the present invention, the device 10 illustrated in FIGS. 1-4 is utilized to implement a method of debris removal. It should be noted that certain embodiments of the present invention may be used in conjunction with other particle cleaning processes, either prior or pursuant to the method discussed herein. It should also be noted that, although only one tip 12 is discussed herebelow, a plurality of tips may be used to implement certain embodiments of the present invention. For example, a plurality of tips could perform embodiments of the methods discussed herein in parallel and at the same time.

The debris method mentioned above includes positioning the tip 12 adjacent to one or more of the particles 20 (i.e., the pieces of debris) illustrated as being on the substrate 18 in FIG. 2. Then, the method includes physically adhering (as opposed to electrostatically adhering) the particles 20 to the tip 12 as also illustrated in FIG. 2 as well as some possible repetitive motion of the tip when in contact with the particle(s) and surrounding surfaces. Pursuant to the physical adherence of the particles 20 to the tip 12, the method includes removing the particles 20 from the substrate 18 by moving the tip 12 away from the substrate 18, and moving the particles 20 to the patch 14, as illustrated in FIG. 3.

According to certain embodiments of the present invention, the method also includes forming the coating 16 on a portion of the tip 12. According to some of these embodiments, the coating 16 includes a coating material that has a lower surface energy than the substrate 18.

In addition to the above, some embodiments of the method also include moving the tip 12 relative to the substrate 18 such that the tip 12 is adjacent to other pieces of debris (not illustrated). Then, these adhered other pieces of debris are removed from the substrate 18 by moving the tip 12 away from the substrate 18 in a manner analogous to what is shown in FIG. 3.

Once debris (e.g., the particles 20 discussed above, have been removed from the substrate 18, some methods according to the present invention include the step of depositing the piece of debris in a piece of material positioned away from the substrate (e.g., the above-discussed patch 14).

Because the tip 12 may be used repeatedly to remove large amounts of debris, according to certain embodiments of the present invention, the method includes replenishing the coating 16 by plunging the tip 12 in the patch 14. In these embodiments, low surface energy material from the patch would coat any holes or gaps that may have developed in the coating 16 over time. This replenishing may involve moving the tip 12 laterally within the patch 14 pursuant to plunging the tip 12 in the patch, rubbing the surface, or changing some other physical parameter (e.g., temperature).

It should be noted that certain methods according to the present invention include exposing a small area around a defect or particle to a low surface energy material before a repair in order to reduce the likelihood that the removed material will lump together and strongly adhere again to the substrate after the repair is completed. For example, a defect/particle and a approximately 1-2 micron area around the defect is pre-coated with PTFE according to certain embodiments of the present invention. In such instances, a tip 12 coated or constructed from a low surface energy material (e.g., a PTFE tip) can be used to apply a very generous amount of the low surface energy material to a repair area even when other repair tools (laser, e-beam) are being utilized.

According to certain embodiments of the present invention, the method includes using the patch 14 to push the particles away from the apex of the tip 12 and toward an AFM cantilever (not illustrated) that is supporting the tip 12. Such pushing up of the particles 20 would free up space near the apex of the tip 12 physically adhere more particles 20.

According to certain embodiments of the present invention, the tip 12 is used to remove nanomachining debris from high aspect ratio structures such as, for example, trench 22, by alternately, "dipping" (or indenting) the tip 12 in a pallet of soft (i.e., "doughy") material, typically found in the patch 14. This soft material generally has greater adherence to the tip 12 and debris material (e.g., in the particles 20) than to itself. The soft material may also be selected to have polar properties to electrostatically attract the nanomachining debris particles 20 to the tip 12. For example, a mobile surfactant may be used.

In addition to the above, according to certain embodiments of the present invention, the tip 12 may include one or more dielectric surfaces (i.e., electrically insulated surfaces). These surfaces may be rubbed on a similarly dielectric surface in certain environmental conditions (e.g., low humidity) to facilitate particle pick-up due to electrostatic surface charging. Also, according to certain embodiments of the present invention, the coating 16 attracts particles by some other short-range mechanism (e.g., hydrogen bonding, chemical reaction, enhanced surface diffusion).

Any tip that is strong and stiff enough to penetrate (i.e., indent) the soft pallet material may be used. Hence, very high aspect tip geometries are within the scope of the present invention. Once the tip is stiff enough to penetrate the soft (possibly adhesive) material, high aspect ratio tips that are strong and flexible are generally selected over tips that are weaker and/or less flexible. This allows for the boundaries of the cleaning vector box to be larger than the repair. Hence, according to certain embodiments of the present invention, the tip can be rubbed into the sides and corners of the repair trench 22. A rough macro-scale analogy of this operation is a stiff bristle being moved inside a deep inner diameter. It should also be noted that, according to certain embodiments of the present invention, the tip 12 may be selected to be more "bristle-like" by including a plurality of rigid nanofibrils (e.g., carbon nanotubes, metal whiskers, etc.). The tip 12 may alternatively be selected to be more "mop-like" by including a plurality of flexible/limp nanofibrils (e.g., polymers, etc.).

According to certain embodiments of the present invention, the detection of whether or not one or more particles have been picked up involves performing a noncontact AFM scan of the region of interest (ROI) to detect particles. The tip 12 is then retracted from the substrate without rescanning until after treatment at the target. However, overall mass of debris material picked up by the tip may also be monitored by relative shifts in the tip's resonant frequency. In addition, other dynamics are used for the same function.

Instead of indenting in a soft material to remove particles 20 as discussed above and as illustrated in FIG. 4, the tip 12 may also be vectored into the patch 14 to remove the particles 20. As such, if the tip inadvertently picks up a particle 20, the particle 20 can be removed by doing another repair. Particularly when a different material is used for depositing the particles 20 by vectoring, then a soft metal such as a gold foil may be used.

In addition to the above, an ultra-violet (UV)-light-curable material, or similarly some other material susceptible to a chemically nonreversible reaction, may be used to coat the tip 12 and to form the coating 16. Before the UV cure, the material picks up particles 20 from the substrate 18. Once the tip 12 is removed from the substrate 18, the tip 12 is exposed to a UV source where the material's properties would be changed to make it less adherent to the tip 12 and more adherent to the material in the patch 14, where the. This, or some other, nonreversible process further enhances, or enables, the selectivity of particle pick up and removal.

Certain embodiments of the present invention provide a variety of advantatges. For example, certain embodiments of the present invention allow for active removal of debris from high aspect trench structures using very high aspect AFM tip geometries. Also, certain embodiments of the present invention may be implemented relatively easily by attaching a low surface energy or soft material pallet to an AFM, along with using a very high aspect tip and making relatively minor adjustments to the software repair sequences currently used by AFM operators. In addition, according to certain embodiments of the present invention, a novel nanomachining tool may be implemented that could be used (like nano-tweezers) to selectively remove particles from the surface of a mask which could not be cleaned by any other method. This may be combined with a more traditional repair where the debris would first be dislodged from the surface with an uncoated tip, then picked up with a coated tip.

Generally, it should be noted that, although a low surface energy material is used in the local clean methods discussed above, other possible variations are also within the scope of the present invention. Typically, these variations create a surface energy gradient (i.e., a Gibbs free energy gradient) that attracts the particle 20 to the tip 12 and that is subsequently reversed by some other treatment to release the particles 20 from the tip 12.

For example, one variation that may be used includes using a high surface energy tip coating. Another variation includes pretreating the particles with a low surface energy material to debond the particles and then contacting the particles with a high surface energy tip coating (sometimes on a different tip). Still another variation includes making use of a chemical energy gradient that corresponds to a chemical reaction occurring between a tip surface coating and the particle surface to bond the two. This is either performed until a tip is exhausted or reversed with some other treatment.

According to still other embodiments of the present invention, adhesives or sticky coatings are used in combination with one or more of the above-listed factors. Also, the surface roughness or small scale (e.g., nanometer-scale) texture can be engineered to maximize particle clean process efficiency.

In addition to the above, mechanical bonding may be used, typically when the tip 12 includes fibrils that, analogously to a mop, are capable of mechanically entangling the particles 20. The mechanical entanglement, according to certain embodiments of the present invention, is driven by and/or enhanced by surface energy or chemical changes with contact or environment.

According to still other embodiments of the present invention, the tip 12 may be coated with molecular tweezers (i.e., molecular clips). These tweezers are noncyclic compounds with open cavities capable of binding guests (e.g., the above-discussed particles 20). The open cavity of the tweezers typically binds guests using non-covalent bonding including hydrogen bonding, metal coordination, hydrophobic forces, van der Waals forces, π-π interactions, and/or electrostatic effects. These tweezers are sometimes analogous to macrocyclic molecular receptors except that the two arms that bind the guest molecules are typically only connected at one end.

Figure 5:
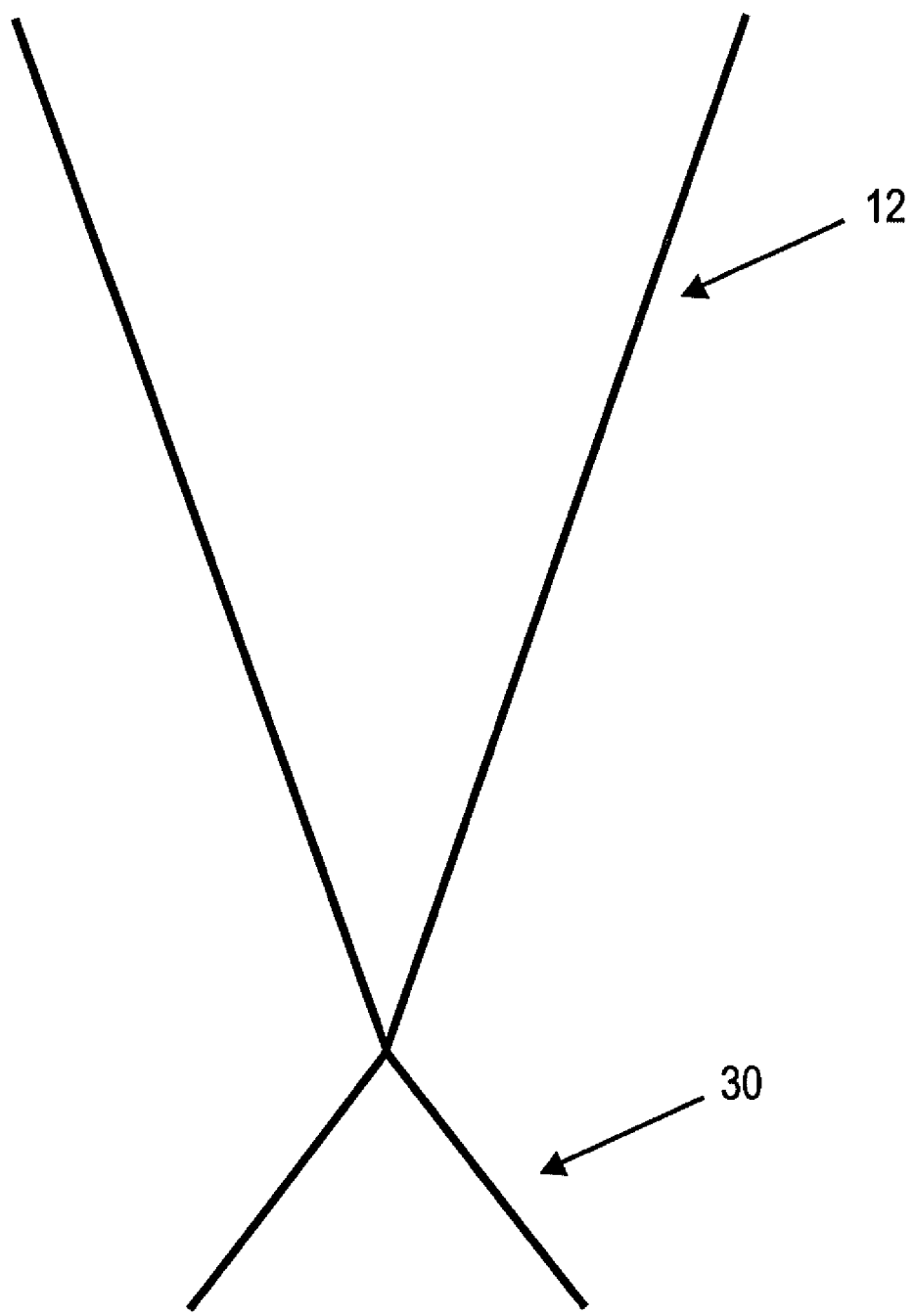
FIG. 5 illustrates a cross-sectional view of a tip according to the present invention.

In addition to the above, the particles 20 may be removed by the tip using diffusion bonding or Casimir effects. Also, as in the embodiments of the present illustrated in FIG. 5, bristles or fibrils 30 can be attached to the end of the tip 12. Whether strategically or randomly placed, these bristles or fibrils 30 can enhance local clean in several ways. For example, an associated increase in surface area may be used for surface (short range) bonding to the particles.

According to some of embodiments of the present invention, fibrils 30 are engineered to be molecules that selectively (e.g., by either surface or environment) coil around and entangle a particle 20, thus maximizing surface contact. Also, dislodging of the particles 20 occurs according to certain embodiments of the present invention, typically when stiff bristles 30 are attached to the tip 12. However, fibrils 30 may also entangle a particle 20 and dislodge the particle 20 mechanically by pulling on the particle 20. In contrast, relatively rigid bristles 30 typically allow the tip 12 to extend into hard-to-reach crevices. Then, by impact deformation stress of the bristles 30, by surface-modification of the tip 12 to repel particles 20, or by some combination, the particle 20 is dislodged. In addition, certain embodiments of the present invention mechanically bond the particles 20 to the tip 12. When fibrils are on the tip 12, entanglement of one or more of either the whole or frayed fibrils may occur. When bristles are on the tip 12, the particle 20 may be wedged between (elastically) stressed bristles.

According to still other embodiments of the present invention, methods of debris removal include changing the environment to facilitate local clean. For example, gas or liquid media may be introduced or the chemistry and/or physical properties (e.g., pressure, temperature, humidity) may be changed.

In addition to the components discussed above, certain embodiments of the present invention include an image recognition system that identifies debris to be removed. As such, an automatic debris-removal device is also within the scope of the present invention.

According to certain embodiments of the present invention, a relatively soft cleaning tip is used to avoid unwanted damage to inside contours, walls, and/or bottom of a complex shape. When appropriate, a stronger force is used to bring the relatively soft tip into much stronger contact with the surface while also increasing the scan speed.

It should also be noted that a tip exposed to and/or coated with a low surface energy material can be used for other purposes besides removing debris (cleaning) of nanometer level structures. For example, such tips can also be used, according to certain embodiments of the present invention, to periodically lubricate micron level or smaller devices (like MEMS/NEMS) to contain chemical reactions.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for removing debris from a trench formed on a surface of a substrate, comprising:
    positioning a tip, having a nanometer-scaled coating with a surface energy lower than the surface energy of the substrate, within the trench;
    moving the tip within the trench to physically adhere the debris to the tip;
    moving the tip with the adhered debris away from the trench; and
    imbedding the debris in a patch of material, attached to a stage that supports the substrate, having a surface energy lower than the surface energy of the debris.

2. The method of claim 1, wherein the tip coating is polytetrafluoroethylene.

3. The method of claim 1, further comprising replenishing the tip coating by plunging the tip into the patch of material.

4. The method of claim 3, wherein the replenishing step includes moving the tip laterally along the patch of material.

5. The method of claim 1, further comprising using the patch to push the debris away from an apex of the tip and toward an atomic force microscope cantilever that supports the tip.

6. The method of claim 1, wherein the tip coating is a metallic material.

7. A system for removing debris from a surface of a substrate, comprising:
    an atomic force microscope, including:
        a cantilever, and
        a tip, supported by the cantilever, having a nanometer-scaled coating with a surface energy lower than the surface energy of the substrate; and
    a patch of material, attached to a stage that supports the substrate, having a surface energy lower than the surface energy of the debris.

8. The system of claim 7, wherein the tip coating is polytetrafluoroethylene.

9. The system of claim 7, wherein the tip coating is a metallic material.

10. The system of claim 7, wherein the patch of material is removably attached to the substrate stage.

* * * * *